US006348424B1

(12) United States Patent
Hazeyama et al.

(10) Patent No.: US 6,348,424 B1
(45) Date of Patent: Feb. 19, 2002

(54) LOW-TEMPERATURE CALCINED GLASS CERAMIC AND A MANUFACTURING PROCESS THEREFOR

(75) Inventors: Ichiro Hazeyama; Kazuhiro Ikuina, both of Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/438,492

(22) Filed: Nov. 12, 1999

(30) Foreign Application Priority Data

Nov. 11, 1998 (JP) ............................................ 10-320612
May 14, 1999 (JP) ............................................ 11-134147

(51) Int. Cl.[7] ........................ C03C 3/062; C03C 3/087; C03C 10/06; C03C 14/00; C03B 29/00
(52) U.S. Cl. ................................ 501/5; 501/8; 501/32; 501/70; 501/72; 501/73; 156/89.11
(58) Field of Search ............................ 501/5, 8, 32, 70, 501/72, 73; 156/89.11

(56) References Cited

U.S. PATENT DOCUMENTS

| 4,366,253 A | * | 12/1982 | Yagi ................................ 501/5 |
| 4,615,987 A | * | 10/1986 | Chyung et al. ................. 501/8 |
| 4,853,349 A | * | 8/1989 | Martin ............................ 501/5 |
| 5,338,710 A | * | 8/1994 | Ishigame et al. ............... 501/8 |

FOREIGN PATENT DOCUMENTS

| JP | 01100060 A | 4/1989 |
| JP | 6-116019 | 4/1994 |
| JP | 6-91319 | 11/1994 |
| JP | 06345530 A | 12/1994 |
| JP | 7-97269 | 4/1995 |
| JP | 7-172905 | 7/1995 |
| JP | 08175864 A | 7/1996 |
| JP | 9-208298 | 8/1997 |
| JP | 10-59767 | 3/1998 |
| JP | 10-194828 | 7/1998 |
| JP | 11-79829 | 3/1999 |

* cited by examiner

*Primary Examiner*—David Sample
(74) *Attorney, Agent, or Firm*—Foley & Lardner

(57) ABSTRACT

A glass having an oxide-converted composition of 35 to 65 wt % of $SiO_2$, 5 to 35 wt % of $B_2O_3$, 2 to 20 wt % of CaO, 5 to 25 wt % of $Al_2O_3$ where the ratio of CaO to $Al_2O_3$ is 1/1 to 1/2.5, 0.5 to 5 wt % of $TiO_2$, 0.5 to 5 wt % of $ZrO_2$, 0.5 to 5 wt % of ZnO, 0 to 5 wt % of MgO, 0 to 5 wt % of SrO, 0 to 5 wt % of BaO and 0 to 1 wt % of the total of group 1A element oxides such as $Na_2O$, $K_2O$ and $Li_2O$, or a glass having an oxide-converted composition of 10 to 45 wt % of $SiO_2$, 20 to 50 wt % of CaO, 20 to 45 wt % of $Al_2O_3$, 0.1 to 5 wt % of MgO, 0.1 to 5 wt % of SrO, 0.1 to 5 wt % of BaO, 0.1 to 5 wt % of $TiO_2$, 0.1 to 5 wt % of ZnO, 0.1 to 5 wt % of $ZrO_2$ and 0 to 3 wt % of a group 1A element oxide has a low glass softening point, can be calcined as a composite with a variety of ceramics at a temperature below 1000° C., precipitates crystals during the calcination process, and can provide a glass ceramic exhibiting a low dielectric constant and a low dielectric loss.

35 Claims, No Drawings

LOW-TEMPERATURE CALCINED GLASS CERAMIC AND A MANUFACTURING PROCESS THEREFOR

BACKGROUND OF THE INVENTION

1. Field of the Invention

This invention relates to a low-temperature calcined inorganic composition which can be simultaneously calcined with a low-resistance conductor such as Au, Ag and Cu. In particular, this invention relates to a low-temperature calcined glass ceramic which has a low dielectric constant and a low dielectric loss at a frequency in microwave and millimeter-wave ranges and which is suitable as an insulating layer in a multilayer wiring board for a microwave or millimeter-wave circuit.

2. Description of the Prior Art

A low-temperature calcined glass ceramic multilayer wiring board has been developed as an effective measure for improving performance of an electronic equipment because it permits a multilayered wiring, a higher density with a fine wiring and a miniaturized wiring; a low-resistance conductor such as Au, Ag and Cu can be selected as a wiring material; and the dielectric constant of an insulating layer may be lowered to allow a signal to be quickly transferred. In addition, a radio-frequency analogue circuit can be electromagnetically shielded because of a contact pattern of conductor plane and a high-density layout of cavity structures and via holes. Therefore, various elements such as a transmitter and receiver module and a DC or RF circuit may be integrated, which leads to miniaturization and performance improvement. Furthermore, a module mounted with multiple MMICs may be miniaturized and improved in its performance. Thus, the wiring board has been developed for use in, for example, a module for a communication device including a high-frequency analogue circuit in a microwave range.

In the field of high-frequency communication devices such as those for mobile communication and satellite communication, it is expected to use a system involving a super high-frequency range such as microwave and millimeter wave in a variety of applications. In the field of communication devices comprising a high-frequency analogue circuit, it is expected to use systems involving not only a microwave band but also a millimeter wave band, a further higher frequency range. In a module equipped with such an analogue circuit involving a super high-frequency range, it is essential to reduce a signal transmission loss. Therefore, for a glass ceramic type of multilayer wiring board, it is needed to minimize a dielectric loss of an insulating material and a resistance of a conductor.

SUMMARY OF THE INVENTION

An object of this invention is to provide a low-temperature calcined glass ceramic which can be calcined at a temperature below 1000° C., i.e., can be calcined simultaneously with a low-resistance conductor such as Au, Ag and Cu for internal mounting or multilayering, and which is suitable for an insulating layer in a multiple layer wiring board equipped with a high-frequency analogue circuit with a low dielectric constant and a low dielectric loss at a frequency within microwave and millimeter wave ranges.

We have intensely investigated a variety of glass compositions in an attempt to solve the problems in a conventional low-temperature calcined glass ceramic, and have found that an $SiO_2$—$B_2O_3$—CaO—$Al_2O_3$ glass with a certain range of composition has a low glass softening point, can be calcined at a temperature below 1000° C. as a composite with various ceramics and is crystallized during a calcination process to exhibit a low dielectric constant and a low dielectric loss, and that an $SiO_2$—CaO—$Al_2O_3$ glass with a certain range of composition, as a composite with various ceramics or alone, can be calcined at a temperature below 1000° C. and is crystallized during a calcination process to exhibit a low dielectric constant and a low dielectric loss.

This invention provides:

(1) A low-temperature calcined glass ceramic consisting of 50 to 100 wt % of glass powder and 0 to 50 wt % of ceramic powder, where the glass powder has an oxide-converted composition of 35 to 65 wt % of $SiO_2$, 5 to 35 wt % of $B_2O_3$, 2 to 20 wt % of CaO, 5 to 25 wt % of $Al_2O_3$ where the ratio of CaO to $Al_2O_3$ is 1/1 to 1/2.5, 0.5 to 5 wt % of $TiO_2$, 0.5 to 5 wt % of $ZrO_2$, 0.5 to 5 wt % of ZnO, 0 to 5 wt % of MgO, 0 to 5 wt % of SrO, 0 to 5 wt % of BaO and 0 to 1 wt % of a group 1A element oxide; and is densified during calcination at 850 to 1000° C.;

(2) A low-temperature calcined glass ceramic described in (1), where the group 1A element oxide is at least one selected from the group consisting of $Na_2O$, $K_2O$ and $Li_2O$;

(3) A low-temperature calcined glass ceramic described in (1) or (2), where alumina is precipitated during the calcination process;

(4) A low-temperature calcined glass ceramic described in (1) or (2), where $CaAl_2SiO_6$ is precipitated during the calcination process;

(5) A low-temperature calcined glass ceramic described in any of (1) to (4), where the ceramic powder is at least one selected from the group consisting of alumina, silica, mullite, cordierite and forsterite;

(6) A low-temperature calcined glass ceramic which is an $SiO_2$—CaO—$Al_2O_3$ glass having an oxide-converted composition of 10 to 45 wt % of $SiO_2$, 20 to 50 wt % of CaO, 20 to 45 wt % of $Al_2O_3$, 0.1 to 5 wt % of MgO, 0.1 to 5 wt % of SrO, 0.1 to 5 wt % of BaO, 0.1 to 5 wt % of $TiO_2$, 0.1 to 5 wt % of ZnO, 0.1 to 5 wt % of $ZrO_2$ and 0 to 3 wt % of a group 1A element oxide; and is densified during calcination at 800 to 1000° C.;

(7) A low-temperature calcined glass ceramic which is a composite comprising ceramic particles dispersed in an $SiO_2$—CaO—$Al_2O_3$ glass having an oxide-converted composition of 10 to 45 wt % of $SiO_2$, 20 to 50 wt % of CaO, 20 to 45 wt % of $Al_2O_3$, 0.1 to 5 wt % of MgO, 0.1 to 5 wt % of SrO, 0.1 to 5 wt % of BaO, 0.1 to 5 wt % of $TiO_2$, 0.1 to 5 wt % of ZnO, 0.1 to 5 wt % of $ZrO_2$ and 0 to 3 wt % of a group 1A element oxide; and is densified during calcination at 800 to 1000° C.;

(8) A low-temperature calcined glass ceramic described in (6) or (7), where the group 1A element oxide is at least one selected from the group consisting of $Na_2O$, $K_2O$ and $Li_2O$;

(9) A low-temperature calcined glass ceramic described in (7) or (8), where the rate of the ceramic particles in the composite is 10 to 50 wt %;

(10) A low-temperature calcined glass ceramic described in any of (7) to (9), where the ceramic particles are particles of at least one selected from $Al_2O_3$(alumina), $SiO_2$(silica), $Mg_2Al_4Si_5O_{18}$(Cordierite), $Mg_2SiO_4$ (Forsterite) and $Al_6Si_2O_{13}$(Mullite);

(11) A low-temperature calcined glass ceramic described in any of (6) to (10), where at least one of the crystals of $CaAl_2SiO_6$, $Ca_3Si_2O_7$(Rankinite), $CaSiO_3$ (Wollastonite) and $Al_6Si_2O_{13}$(Mullite) is precipitated;

(12) A process for manufacturing a low-temperature calcined glass ceramic, comprising the steps of:
(A) film deposition where a green sheet is prepared from a mixed powder consisting of 50 to 100 wt % of $SiO_2$—CaO—$Al_2O_3$ glass powder and 0 to 50 wt % of ceramic powder;
(B) lamination where the green sheet is piled up and is then hot-pressed to give a laminate;
(C) calcination where the laminate from the above step is calcined at a temperature of 800 to 1000° C. to give a sintered compact, characterized in that the glass has an oxide-converted composition of 10 to 45 wt % of $SiO_2$, 20 to 50 wt % of CaO, 20 to 45 wt % of $Al_2O_3$, 0.1 to 5 wt % of MgO, 0.1 to 5 wt % of SrO, 0.1 to 5 wt % of BaO, 0.1 to 5 wt % of $TiO_2$, 0.1 to 5 wt % of ZnO, 0.1 to 5 wt % of $ZrO_2$ and 0 to 3 wt % of a group 1A element oxide;

(13) A process for manufacturing a low-temperature calcined glass ceramic described in (12), where the group 1A element oxide is at least one selected from the group consisting of $Na_2O$, $K_2O$ and $Li_2O$;

(14) A process for manufacturing a low-temperature calcined glass ceramic described in (12) or (13), where the ceramic particles are particles of at least one selected from $Al_2O_3$(Alumina), $SiO_2$(Silica), $Mg_2Al_4Si_5O_{18}$ (Cordierite), $Mg_2SiO_4$(Forsterite), $CaAl_2SiO_7$, $Ca_3Si_2O_7$(Rankinite), $CaSiO_3$(Wollastonite) and $Al_6Si_2O_{13}$(Mullite);

(15) A process for manufacturing a low-temperature calcined glass ceramic described in any of (12) to (14), where during the calcination at least one of the crystals of $CaAl_2SiO_6$, $Ca_3Si_2O_7$(Rankinite), $CaSiO_3$ (Wollastonite) and $Al_6Si_2O_{13}$(Mullite) is precipitated.

The low-temperature calcined glass ceramic of this invention allows a multilayer wiring to be made of a low-resistance conductor, and thus provides a multilayer wiring board with excellent high-frequency properties.

DETAILED DESCRIPTION OF PREFERRED EMBODIMENTS

A first embodiment of this invention will be described.

The first low-temperature calcined glass ceramic of this invention consists of 50 to 100 wt % of glass powder and 0 to 50 wt % of ceramic powder, where the glass powder has an oxide-converted composition of 35 to 65 wt % of $SiO_2$, 5 to 35 wt % of $B_2O_3$, 2 to 20 wt % of CaO, 5 to 25 wt % of $Al_2O_3$ where the ratio of CaO to $Al_2O_3$ is 1/1 to 1/2.5, 0.5 to 5 wt % of $TiO_2$, 0.5 to 5 wt % of $ZrO_2$, 0.5 to 5 wt % of ZnO, 0 to 5 wt % of MgO, 0 to 5 wt % of SrO, 0 to 5 wt % of BaO and 0 to 1 wt % of the total of group 1A element oxides including $Na_2O$, $K_2O$ and $Li_2O$; and where mainly alumina and $CaAl_2SiO_6$ are precipitated during calcination.

A composition consisting of, as converted to an oxide, 35 to 65 wt % of $SiO_2$, 5 to 35 wt % of $B_2O_3$, 2 to 20 wt % of CaO, 5 to 25 wt % of $Al_2O_3$ where the ratio of CaO to $Al_2O_3$ is 1/1 to 1/2.5 precipitates a crystal phase consisting of alumina and $CaAl_2SiO_6$ during calcination, to give a sintered compact exhibiting a low dielectric constant and a low dielectric loss. In particular, a composition consisting of 35 to 65 wt % of $SiO_2$, 5 to 30 wt % of $B_2O_3$, 2 to 17.5 wt % of CaO, 5 to 17.5 wt % of $Al_2O_3$ where the ratio of CaO to $Al_2O_3$ is 1/1 to 1/2.5 is preferable because it has a relatively lower glass softening point and exhibits a low dielectric constant and a low dielectric loss. Said composition, however, has a considerably high glass softening point, which makes sintering at a temperature below 1000° C. difficult.

Adding 0.5 to 5 wt % of $TiO_2$, 0.5 to 5 wt % of $ZrO_2$ and 0.5 to 5 wt % of ZnO to the composition may lower a glass softening point without significantly deteriorating dielectric properties. It is undesirable to add any of these additives in more than 5 wt % due to significant deterioration of dielectric properties, while less than 0.5 wt % of any of these additives may not be very effective. One to three wt % of $TiO_2$, 1 to 3 wt % of $ZrO_2$ and 1 to 3 wt % of ZnO are added in the light of the effect of lowering a glass softening point while maintaining a low dielectric constant and a low dielectric loss. It is effective to add 0 to 5 wt % of MgO, 0 to 5 wt % of SrO and 0 to 5 wt % of BaO because they may, as with the above additives, lower a glass softening point. Adding more than 5 wt % of these is undesirable due to significantly deteriorating dielectric properties. It is preferable to add 0.5 to 3 wt % of MgO, 0.5 to 3 wt % of SrO and 0.5 to 3 wt % of BaO in the light of the effect of lowering a glass softening point while maintaining a low dielectric constant and a low dielectric loss. To further lower a glass softening point, it may be effective to add 0 to 1 wt % of $Na_2O$, $K_2O$ and/or $Li_2O$. It is undesirable to add $Na_2O$, $K_2O$ and/or $Li_2O$ in more than 1 wt % as a total due to increase of dielectric loss.

Thus, a glass composition consisting of 35 to 65 wt % of $SiO_2$, 5 to 35 wt % of $B_2O_3$, 2 to 20 wt % of CaO, 5 to 25 wt % of $Al_2O_3$ where the ratio of CaO to $Al_2O_3$ is 1/1 to 1/2.5, 0.5 to 5 wt % of $TiO_2$, 0.5 to 5 wt % of $ZrO_2$, 0.5 to 5 wt % of ZnO, 0 to 5 wt % of MgO, 0 to 5 wt % of SrO, 0 to 5 wt % of BaO and 0 to 1 wt % of the total of group 1A element oxides including $Na_2O$, $K_2O$ and $Li_2O$, preferably consisting of 35 to 65 wt % of $SiO_2$, 5 to 30 wt % of $B_2O_3$, 2 to 17.5 wt % of CaO, 5 to 17.5 wt % of $Al_2O_3$ where the ratio of CaO to $Al_2O_3$ is 1/1 to 1/2.5, 1 to 3 wt % of $TiO_2$, 1 to 3 wt % of $ZrO_2$, 1 to 3 wt % of ZnO, 0.5 to 3 wt % of MgO, 0.5 to 3 wt % of SrO and 0.5 to 3 wt % of BaO has a low glass softening point, and a glass ceramic consisting of 50 to 100 wt % of the glass powder and 0 to 50 wt % of ceramic powder can be calcined at a temperature below 1000° C. Therefore, the glass ceramic allows a multiple layer wiring to be formed by simultaneous calcination with a low-resistance conductor such as Au, Ag and Cu. and may achieve a low dielectric constant and a low dielectric loss in both microwave and millimeter wave frequency bands.

The ceramic powder may be any of alumina, silica, mullite, cordierite, forsterite and so forth, but preferably a material with a low dielectric constant and a low dielectric loss is selected for avoiding deterioration of dielectric properties. A composite of glass and ceramic consisting of glass and ceramic is preferable because it may improve strength. More than 50 wt % of the rate of the ceramic powder is undesirable because it requires a higher calcination temperature. It is preferable to use 5 to 30 wt % of ceramic powder in the light of dielectric properties, strength and a calcination temperature.

The second embodiment of this invention will be described.

The second low-temperature calcined glass ceramic of this invention is an $SiO_2$—CaO—$Al_2O_3$ glass or a composite comprising ceramic particles dispersed in the glass, where the glass has an oxide-converted composition of 10 to 45 wt % of $SiO_2$, 20 to 50 wt % of CaO, 20 to 45 wt % of $Al_2O_3$, 0.1 to 5 wt % of MgO, 0.1 to 5 wt % of SrO, 0.1 to 5 wt % of BaO, 0.1 to 5 wt % of $TiO_2$, 0.1 to 5 wt % of ZnO, 0.1 to 5 wt % of $ZrO_2$ and 0 to 3 wt % of a group 1A element oxide. An $SiO_2$—CaO—$Al_2O_3$ glass having such a composition can be calcined at a temperature of 800 to 1000° C., alone or as a composite with ceramic particles, permitting a multilayer wiring board to be prepared using a low melting-point and low resistance conductor such as Au, Ag and Cu as an internal-layer wiring material. An $SiO_2$—CaO—$Al_2O_3$ glass having such a composition exhibits a low dielectric constant and a low dielectric loss. It is, therefore, suitable for an insulating layer in a multilayer wiring board for a high-frequency circuit.

The above composition will be described in detail. A glass having a composition within the above range may be calcined at a temperature below 1000° C. In particular, it is preferable for low-temperature calcination to add each of MgO, SrO, BaO, $TiO_2$, ZnO and $ZrO_2$ in an amount of 0.1 to 5 wt % for lowering a softening point and a temperature range in calcination. An excessive amount of these additives may, however, adversely affect a low dielectric loss which is a characteristic of a low-temperature calcined glass ceramic, leading to increase of a dielectric loss. Their individual amounts must be, therefore, below 5 wt %. On the other hand, when they are added in too small amounts, a calcination temperature range may be raised, making calcination at 1000° C. or lower difficult. Their amounts must be, therefore, at least 0.1 wt %. In particular, it is preferable to add each of these additives in an amount of 0.5 wt % to 2 wt % both inclusive because it allows calcination temperature to be about 900° C.

Addition of a group 1A element oxide may significantly lower a glass softening point and thus is effective for lowering a calcination temperature, but may largely increase a dielectric loss. The amount must be, therefore, below 3 wt %, preferably below 1 wt %.

A composite of the glass having the above composition with ceramic particles may be useful because material strength, a dielectric constant, a dielectric loss and a coefficient of thermal expansion can be modified by selecting ceramic particles as appropriate. The rate of ceramic particles is preferably below 50 wt %. If it is more than 50 wt %, calcination at a temperature below 1000° C. is considerably difficult. The blending rate is preferably 10 wt % to 30 wt % both inclusive because it is effective for improving material strength. The ceramic may be selected from alumina, silica, mullite, cordierite and forsterite, and preferably a material with a low dielectric constant and a low dielectric loss in the light of preventing deterioration of dielectric properties.

A glass having the above composition precipitates the crystals of $CaAl_2SiO_6$, $Ca_3Si_2O_7$(Rankinite), $CaSiO_3$ (Wollastonite) and/or $Al_6Si_2O_{13}$(Mullite) during a calcination process at a temperature of 800 to 1000° C. The crystals are precipitated in different ways depending on a glass composition and calcination conditions, but such precipitation itself may be effective for reducing a dielectric loss and improving material strength.

For preparation of a multilayer wiring board using the second low-temperature calcined glass ceramic of this invention, a green sheet lamination technique may be effective. In a solvent as a dispersion medium are added a glass powder having the above composition with an average particle size of some submicrons to several microns, a plasticizer and a binder, and the mixture is blended to provide a slurry. The slurry is subject to an appropriate film-forming process such as a slip casting method to give a green sheet. The particle size of the glass powder may vary depending on a calcination temperature, a shrinkage rate between before and after calcination and the amounts of different organic vehicles during preparation of the slurry, and the average particle size is preferably 1 to 3 $\mu$m in the light of handling properties. When the low-temperature calcined glass ceramic is used as a composite with ceramic particles, the ceramic particles may have an average size of some submicrons to several microns. The particle size may influence a variety of factors as described in terms of the above glass powder. Particles with an average size of about 0.5 to 2 $\mu$m is preferable because they are effective for improving material strength. Some elements such as a via conductor, a circuit and a cavity are formed on the green sheet. The processed green sheet is piled and then hot-pressed to be laminated. The laminate is subject to calcination at a temperature of 800 to 1000° C. to provide a multilayer wiring board. In the calcination process, the glass having the above composition precipitates different crystals, depending on factors such as calcination conditions and a glass composition. Such precipitation allows an insulating layer to exhibit a further lower dielectric loss, a substrate to be stronger, and a multilayer wiring board to be provided, which is suitable for mounting a high frequency circuit on it.

This invention will be specifically described, but this invention is not limited to Examples below, within the scope of this invention.

EXAMPLE 1

A glass having Composition 1 shown in Table 1 was prepared and was subject to wet grinding using ethanol as a dispersion medium. After sieving, ethanol is filtered off and the glass was dried to provide a glass powder with an average particle size of about 2 $\mu$m. Then, an alumina powder with an average particle size of about 1 $\mu$m was weighed and added to the above glass powder in an amount to give a mixture of 5 wt % of alumina and 95 wt % of the glass powder, and the mixture was blended in a ball mill for 3 hours using ethanol as a dispersion medium. After removing ethanol by filtration, the powder was overdried to provide homogeneous Mixed powder A. In a similar manner, glass powders having Compositions 2 and 3 shown in Table 1 were subject to dry grinding, sieving, filtering and drying, to provide glass powders having an average particle size of 2 $\mu$m. Then, an alumina powder with an average particle size of about 1 $\mu$m was weighed and added to the above glass powders in an amount to give mixtures of 10 wt % of alumina and 90 wt % of the glass powder and of 30 wt % of alumina and 70 wt % of the glass powder to prepare Mixed powders B and C, respectively as described above. To each of Mixed powders A, B and C were added an organic binder, a plasticizer and a solvent as a dispersion Amedium, and the mixture was thoroughly kneaded in a ball mill to prepare a slurry with a viscosity of 3000 to 10000 cps. Herein, any binder, plasticizer or organic vehicle such as a solvent, which is generally used, may be satisfactorily used and their components are not specifically limited. Each slurry obtained was subject to a slip casting film-forming process to prepare a green sheet having a thickness of from 50 $\mu$m to 200 $\mu$m. The individual green sheets prepared were hot-pressed to provide green sheet laminates. Three types of the green sheet laminates thus obtained were calcined in the air at a temperature up to 1000° C., to provide Calcined materials A, B and C, which correspond to Mixed powders A, B and C, respectively. Dielectric properties for each Calcined material were evaluated by processing the material into a cylinder with a diameter of about 12 mm and a height of about 5 mm and then determining its dielectric constant and dielectric loss tangent by a cavity resonator technique. Calcined materials A, B and C had dielectric constants of 7.2, 7.4 and 7.5 in the 10 GHz band, respectively, while having dielectric loss tangents of 0.0012, 0.0015 and 0.0018, respectively. The results show that these materials had a low dielectric constant and a low dielectric loss.

EXAMPLE 2

Glasses having Compositions 5 and 6 shown in Table 1 were prepared and processed as described in Example 1, to provide Mixed powders D and E having an average particle size of about 2 μm, respectively. To each of Mixed powders D and E were added an organic binder, a plasticizer and a solvent as a dispersion medium, and the mixture was kneaded in a ball mill to prepare a slurry with a viscosity of 3000 to 10000 cps. Each slurry obtained was subject to a slip casting film-forming process to prepare a green sheet about 100 μm of thickness. The individual green sheets prepared were piled and hot-pressed to provide Green sheet laminates D and E. Green sheet laminate D consisting of a glass having Composition 5 shown in Table 1 was calcined in the air at a temperature up to 900° C. to provide Calcined material D, while Green sheet laminate E consisting of a glass having Composition 6 shown in Table 1 was calcined in the air at a temperature up to 850° C. to provide Calcined material E. These materials were processed into a cylinder with a diameter of about 12 mm and a height of about 5 mm and were evaluated for their dielectric constant and dielectric loss tangent by a cavity resonator technique. Calcined materials D and E exhibited dielectric constants of 6.0 and 6.4 in the 10 GHz band, respectively, and dielectric loss tangents of 0.0011 and 0.0018, respectively. The results show that these materials had a low dielectric constant and a low dielectric loss. Their crystal phases were determined by an X-ray diffraction technique, indicating that for Calcined material D, besides a glass phase, alumina and $CaAl_2SiO_6$ were precipitated while for Calcined material E, besides a glass phase, alumina was precipitated.

EXAMPLE 3

A glass having Composition 7 shown in Table 1 was prepared and processed as described in Example 1, to provide a glass powder having an average particle size of about 2 μm. To the glass powder was added cordierite powder about 1 μm of average particle size in an amount to give a mixture of 80 wt % of the glass powder and 20 wt % of the cordierite powder. Using ethanol as a dispersion medium, the mixture was blended in a ball mill for 3 hours and ethanol was removed by filtration. The mixture was dried to give a homogeneous mixed powder, which was processed as described in Example 1, to provide a green sheet about 100 μm of thickness. The green sheet prepared was piled and hot-pressed to provide a green sheet laminate. The green sheet laminate was calcined in the air at a temperature up to 850° C. to provide Calcined material F. The material was processed into a cylinder with a diameter of about 14 mm and a height of about 6 mm and were evaluated for their dielectric constant and dielectric loss tangent in the 10 GHz band by a cavity resonator technique. Its dielectric constant and dielectric loss tangent were 5.6 and 0.0009, respectively, which indicate that the material had a low dielectric constant and a low dielectric loss.

EXAMPLE 4

A glass having Composition 8 shown in Table 1 was prepared and processed as described in Example 1, to provide a glass powder having an average particle size of about 2 μm. To the glass powder was added alumina powder about 1 μm of average particle size in an amount to give a mixture of 90 wt % of the glass powder and 10 wt % of the alumina powder. Using ethanol as a dispersion medium, the mixture was blended in a ball mill for 3 hours and ethanol was removed by filtration. The mixture was dried to give a homogeneous mixed powder. To the mixed powder were added an organic binder, a plasticizer and a solvent as a dispersion medium, and the mixture was thoroughly kneaded in a ball mill to prepare a slurry with a viscosity of about 5000 cps. The slurry was subject to a slip casting film-forming process to prepare a green sheet about 100 μm of thickness. The green sheet prepared was cut into a predetermined shape. At a given site in the green sheet was formed a via hole, which was then filled with Ag paste. Then, on each green sheet was formed a wiring pattern by printing Ag paste by screen printing. The green sheets thus obtained were piled and heat-pressed to prepare a laminate. The laminate was calcined in the air at a temperature up to 900° C., to provide a multilayer wiring board. For the insulating layer of the multilayer wiring board, a dielectric constant and a dielectric loss tangent were determined by a cavity resonator technique. Thus, a dielectric constant and a dielectric loss tangent in the 10 GHz band were 7.2 and 0.0009, respectively. The specific resistance of the conductor was determined to be about 3 μΩ·cm. The results indicate that the multilayer wiring board comprises an insulating layer with a low dielectric constant and a low dielectric loss in a high-frequency band and is suitable for a high-frequency analogue circuit board comprising a low-resistance conductor.

TABLE 1

| | Composition | | | | | | | |
|---|---|---|---|---|---|---|---|---|
| | 1 | 2 | 3 | 4 | 5 | 6 | 7 | 8 |
| $SiO_2$ | 57 | 55 | 54 | 54 | 60 | 59 | 33 | 33 |
| $B_2O_3$ | 6 | 5 | 5 | 4 | 23 | 23 | 33 | 24 |
| CaO | 9 | 9 | 9 | 9 | 4 | 4 | 9 | 14 |
| $Al_2O_3$ | 22 | 22 | 22 | 22 | 4 | 4 | 19 | 23 |
| $TiO_2$ | 2 | 2 | 2 | 2 | 2 | 2 | 2 | 2 |
| $ZrO_2$ | 2 | 2 | 2 | 2 | 2 | 2 | 2 | 2 |
| ZnO | 2 | 2 | 2 | 2 | 2 | 2 | 2 | 2 |
| MgO | 0 | 1 | 1 | 1 | 1 | 1 | 0 | 0 |
| SrO | 0 | 1 | 1 | 1 | 1 | 1 | 0 | 0 |
| BaO | 0 | 1 | 1 | 1 | 1 | 1 | 0 | 0 |
| $Na_2O$ | 0 | 0 | 0.5 | 1 | 0 | 1 | 0 | 0 |
| $K_2O$ | 0 | 0 | 0.5 | 1 | 0 | 0 | 0 | 0 |
| Note | Ex.1 | Ex.1 | Ex.1 | *Dev | Ex.2 | Ex.2 | Ex.3 | Ex.4 |

*Dev. = deviated from the limits

EXAMPLE 5

A glass having Composition 1 shown in Table 2 was prepared and was subject to wet grinding using ethanol as a dispersion medium. After removing ethanol by filtration and drying, the glass was sieved to provide Glass powder A with an average particle size of about 1 μm. In a similar manner, glasses having Compositions 2 and 3 shown in Table 2 were prepared and sieved to provide Glass powders B and C with an average particle size of about 1 μm. To each of Glass powders A, B and C were added an organic binder, a plasticizer and a solvent as a dispersion medium, and the mixture was thoroughly kneaded in a ball mill to prepare a slurry with a viscosity of 3000 to 10000 cps. Herein, any binder, plasticizer or organic vehicle such as a solvent, which is generally used, may be satisfactorily used and their components are not specifically limited. Each slurry obtained was subject to a slip casting film-forming process to prepare a green sheet 100 μm of thickness. The individual green sheets prepared were piled and hot-pressed to provide a Green sheet laminates A, B and C. Green sheet laminates A and B were calcined at 900° C. and Green sheet laminate C was calcined at 1000° C. to provide Calcined materials A, B and C. Herein, Green sheet laminates A, B and C and Calcined materials A, B and C correspond to Glass powders A, B and C, respectively. Each calcined material was examined for its crystal phase by an X-ray diffraction technique. The examination indicated Rankinite, Wollastonite and $CaAl_2SiO_6$ for Calcined material A; Mullite and $CaAl_2SiO_6$ for Calcined material B; and $CaAl_2SiO_6$ for Calcined material C. Dielectric properties for each Calcined material were evaluated by processing the material into a cylinder with a diameter of about 12 mm and a height of about 5 mm and then determining its dielectric constant and dielectric loss tangent by a cavity resonator technique. Calcined materials A, B and C had dielectric constants of 6, 7 and 7 in the 10 GHz band, respectively, while having dielectric loss tangents of 0.001. The results show that these materials had a low dielectric constant and a low dielectric loss.

EXAMPLE 6

A glass having Composition 4 shown in Table 2 was prepared and processed as described in Example 5, to provide Glass powder D having an average particle size of about 2 μm. To the glass powder was added cordierite powder about 1 μm of average particle size in an amount to give a mixture of 20 wt % of the cordierite powder and 80 wt % of Glass powder D. Using ethanol as a dispersion medium, the mixture was blended in a ball mill for 3 hours and ethanol was removed by filtration. The mixture was dried to give a homogeneous Mixed powder D. In a similar manner, a homogeneous Mixed powder E was prepared consisting of 80 wt % of Glass powder E having Composition 5 shown in Table 2 and 20 wt % of amorphous quartz powder 1 μm of average particle size. Green sheet laminates D and E were prepared from Mixed powders D and E, respectively, as described in Example 5. These were calcined at 950° C. to give Calcined materials D and E, respectively. Evaluation of dielectric properties by a cavity resonator technique indicated that in the 10 GHz band, Calcined materials D and E had dielectric constants of 5.5 and 6 and dielectric loss tangents of 0.001 and 0.001, respectively. The results show that these materials had a low dielectric constant and a low dielectric loss.

EXAMPLE 7

A glass having Composition 6 shown in Table 2 was prepared and processed as described in Example 5, to provide a glass powder having an average particle size of about 1 μm. To the glass powder was added alumina powder about 1 μm of average particle size in an amount to give a mixture of 70 wt % of the glass powder and 30 wt % of the alumina powder. Using ethanol as a dispersion medium, the mixture was blended in a ball mill for 3 hours and ethanol was removed by filtration. The mixture was dried to give a homogeneous mixed powder. To the mixed powder were added an organic binder, a plasticizer and a solvent as a dispersion medium, and the mixture was thoroughly kneaded in a ball mill to prepare a slurry with a viscosity of about 5000 cps. The slurry was subject to a slip casting film-forming process to prepare a green sheet about 100 μm of thickness. The green sheet prepared was cut into a predetermined shape. At a given site in the green sheet was formed a via hole, which was then filled with Au paste. Then, on each green sheet was formed a wiring pattern by printing Au paste by screen printing. Besides Au paste, a conductor for wiring may be selected a variety of pastes such as Cu paste, CuO paste, Ag paste and Ag paste containing Pd and Pt as necessary. The green sheets thus obtained were piled and heat-pressed to prepare a laminate. The laminate was calcined in the air at 900° C., to provide a multilayer wiring board. The microstrip line of the multilayer wiring board was evaluated for its transmission characteristics, giving a loss of 0.1 dB/mm at 30 GHz. The results indicate that the multilayer wiring board is suitable for mounting a high-frequency analogue circuit board.

TABLE 2

| | Glass Composition | | | | | | | | | | |
|---|---|---|---|---|---|---|---|---|---|---|---|
| | $SiO_2$ | CaO | $Al_2O_3$ | MgO | SrO | $TiO_2$ | ZnO | $ZrO_2$ | $Na_2O$ | $Ka_2O$ | Note |
| Comp. 1 | 36 | 36 | 18 | 2 | 2 | 2 | 2 | 2 | 0 | 0 | Ex.5 |
| Comp. 2 | 36 | 18 | 36 | 2 | 2 | 2 | 2 | 2 | 0 | 0 | Ex.5 |
| Comp. 3 | 18 | 36 | 36 | 2 | 2 | 2 | 2 | 2 | 0 | 0 | Ex.5 |
| Comp. 4 | 38 | 18 | 38 | 1 | 0.5 | 2 | 1 | 0.5 | 0.5 | 0.5 | Ex.6 |
| Comp. 5 | 10 | 45 | 37 | 2 | 0.5 | 2 | 2 | 0.5 | 0.5 | 0.5 | Ex.6 |
| Comp. 6 | 36 | 36 | 20 | 2 | 0.5 | 2 | 1.5 | 0.5 | 0.5 | 1 | Ex.7 |

As described above, the low-temperature calcined glass ceramic of this invention can be calcined at a temperature below 1000° C., i.e., can be calcined simultaneously with a low-resistance conductor such as Au, Ag and Cu for internal mounting, and can provide a multilayer wiring board suitable for mounting a high-frequency analogue circuit comprising an insulating layer with a low dielectric constant and a low dielectric loss in microwave and millimeter wave frequency bands.

What is claimed is:

1. A low-temperature calcined glass ceramic which is an $SiO_2$—CaO—$Al_2O_3$ glass consisting of an oxide-converted composition of 10 to 45 wt % of $SiO_2$, 20 to 50 wt % of CaO, 20 to 45 wt % of $Al_2O_3$, 0.1 to 5 wt % of MgO, 0.1 to 5 wt % of SrO, 0.1 to 5 wt % of BaO, 0.1 to 5 wt % of $TiO_2$, 0.1 to 5 wt % of ZnO, 0.1 to 5 wt % of $ZrO_2$ and 0 to 3 wt % of a group 1A element oxide; and is densified during calcination at 800 to 1000° C.

2. A low-temperature calcined glass ceramic as claimed in claim 1, where the group 1A element oxide is at least one selected from the group consisting of $Na_2O$, $K_2O$ and $Li_2O$.

3. A low-temperature calcined glass ceramic as claimed in claim 2, further comprising ceramic particles dispersed in the glass, where a rate of the ceramic particles in the glass and ceramic particle composite is 10 to 50 wt %.

4. A low-temperature calcined glass ceramic as claimed in claim 3, where the ceramic particles are particles of at least one selected from the group consisting of $Al_2O_3$ (alumina), $SiO_2$ (silica), $Mg_2Al_4Si_5O_{18}$ (Cordierite), $Mg_2SiO_4$ (Forsterite) and $Al_6Si_2O_{13}$ (Mullite).

5. A low-temperature calcined glass ceramic as claimed in claim 4, where at least one of the crystals of $CaAl_2SiO_6$, $Ca_3Si_2O_7$ (Rankinite), $CaSiO_3$ (Wollastonite) and $Al_6Si_2O_{13}$ (Mullite) is precipitated from the glass during the calcination.

6. A low-temperature calcined glass ceramic as claimed in claim 3, where at least one of the crystals of $CaAl_2SiO_6$, $Ca_3Si_2O_7$ (Rankinite), $CaSiO_3$ (Wollastonite) and $Al_6Si_2O_{13}$ (Mullite) is precipitated from the glass during the calcination.

7. A low-temperature calcined glass ceramic as claimed in claim 2, where at least one of the crystals of $CaAl_2SiO_6$, $Ca_3Si_2O_7$ (Rankinite), $CaSiO_3$ (Wollastonite) and $Al_6Si_2O_{13}$ (Mullite) is precipitated from the glass during the calcination.

8. A low-temperature calcined glass ceramic as claimed in claim 1, where at least one of the crystals of $CaAl_2SiO_6$, $Ca_3Si_2O_7$ (Rankinite), $CaSiO_3$ (Wollastonite) and $Al_6Si_2O_{13}$ (Mullite) is precipitated from the glass during the calcination.

9. A multilayer wiring board comprising the glass ceramic of claim 1, a conductor and a circuit.

10. A low-temperature calcined glass ceramic which is a composite comprising ceramic particles dispersed in an $SiO_2$—$CaO$—$Al_2O_3$ glass comprising an oxide-converted composition of 10 to 45 wt % of $SiO_2$, 20 to 50 wt % of CaO, 20 to 45 wt % of $Al_2O_3$, 0.1 to 5 wt % of MgO, 0.1 to 5 wt % of SrO, 0.1 to 5 wt % of BaO, 0.1 to 5 wt % of $TiO_2$, 0.1 to 5 wt % of ZnO, 0.1 to 5 wt % of $ZrO_2$ and 0 to 3 wt % of a group 1A element oxide; and is densified during calcination at 800 to 1000° C.

11. A low-temperature calcined glass ceramic as claimed in claim 10, where the group 1A element oxide is at least one selected from the group consisting of $Na_2O$, $K_2O$ and $Li_2O$.

12. A low-temperature calcined glass ceramic as claimed in claim 11, where a rate of the ceramic particles in the composite is 10 to 50 wt %.

13. A low-temperature calcined glass ceramic as claimed in claim 12, where the ceramic particles are particles of at least one selected from the group consisting of $Al_2O_3$ (alumina), $SiO_2$ (silica), $Mg_2Al_4Si_5O_{18}$ (Cordierite), $Mg_2SiO_4$ (Forsterite) and $Al_6Si_2O_{13}$ (Mullite).

14. A low-temperature calcined glass ceramic as claimed in claim 13, where at least one of the crystals of $CaAl_2SiO_6$, $Ca_3Si_2O_7$ (Rankinite), $CaSiO_3$ (Wollastonite) and $Al_6Si_2O_{13}$ (Mullite) is precipitated from the glass during the calcination.

15. A low-temperature calcined glass ceramic as claimed in claim 12, where at least one of the crystals of $CaAl_2SiO_6$, $Ca_3Si_2O_7$ (Rankinite), $CaSiO_3$ (Wollastonite) and $Al_6Si_2O_{13}$ (Mullite) is precipitated from the glass during the calcination.

16. A low-temperature calcined glass ceramic as claimed in claim 11, where the ceramic particles are particles of at least one selected from the group consisting of $Al_2O_3$ (alumina), $SiO_2$ (silica), $Mg_2Al_4Si_5O_{18}$ (Cordierite), $Mg_2SiO_4$ (Forsterite) and $Al_6Si_2O_{13}$ (Mullite).

17. A low-temperature calcined glass ceramic as claimed in claim 16, where at least one of the crystals of $CaAl_2SiO_6$, $Ca_3Si_2O_7$ (Rankinite), $CaSiO_3$ (Wollastonite) and $Al_6Si_2O_{13}$ (Mullite) is precipitated from the glass during the calcination.

18. A low-temperature calcined glass ceramic as claimed in claim 11, where at least one of the crystals of $CaAl_2SiO_6$, $Ca_3Si_2O_7$ (Rankinite), $CaSiO_3$ (Wollastonite) and $Al_6Si_2O_{13}$ (Mullite) is precipitated from the glass during the calcination.

19. A low-temperature calcined glass ceramic as claimed in claim 10, where a rate of the ceramic particles in the composite is 10 to 50 wt %.

20. A low-temperature calcined glass ceramic as claimed in claim 19, where the ceramic particles are particles of at least one selected from the group consisting of $Al_2O_3$ (alumina), $SiO_2$ (silica), $Mg_2Al_4Si_5O_{18}$ (Cordierite), $Mg_2SiO_4$ (Forsterite) and $Al_6Si_2O_{13}$ (Mullite).

21. A low-temperature calcined glass ceramic as claimed in claim 19, where at least one of the crystals of $CaAl_2SiO_6$, $Ca_3Si_2O_7$ (Rankinite), $CaSiO_3$ (Wollastonite) and $Al_6Si_2O_{13}$ (Mullite) is precipitated from the glass during the calcination.

22. A low-temperature calcined glass ceramic as claimed in claim 10, where the ceramic particles are particles of at least one selected from the group consisting of $Al_2O_3$ (alumina), $SiO_2$ (silica), $Mg_2Al_4Si_5O_{18}$ (Cordierite), $Mg_2SiO_4$ (Forsterite) and $Al_6Si_2O_{13}$ (Mullite).

23. A low-temperature calcined glass ceramic as claimed in claim 22, where at least one of the crystals of $CaAl_2SiO_6$, $Ca_3Si_2O_7$ (Rankinite), $CaSiO_3$ (Wollastonite) and $Al_6Si_2O_{13}$ (Mullite) is precipitated from the glass during the calcination.

24. A low-temperature calcined glass ceramic as claimed in claim 23, where at least one of the crystals of $CaAl_2SiO_6$, $Ca_3Si_2O_7$ (Rankinite), $CaSiO_3$ (Wollastonite) and $Al_6Si_2O_{13}$ (Mullite) is precipitated from the glass during the calcination.

25. A low-temperature calcined glass ceramic as claimed in claim 10, where at least one of the crystals of $CaAl_2SiO_6$, $Ca_3Si_2O_7$ (Rankinite), $CaSiO_3$ (Wollastonite) and $Al_6Si_2O_{13}$ (Mullite) is precipitated from the glass during the calcination.

26. A low-temperature calcined glass ceramic as claimed in claim 10, wherein the $SiO_2$—$CaO$—$Al_2O_3$ glass consists essentially of an oxide-converted composition of 10 to 45 wt % of $SiO_2$, 20 to 50 wt % of CaO, 20 to 45 wt % of $Al_2O_3$, 0.1 to 5 wt % of MgO, 0.1 to 5 wt % of SrO, 0.1 to 5 wt % of BaO, 0.1 to 5 wt % of $TiO_2$, 0.1 to 5 wt % of ZnO, 0.1 to 5 wt % of $ZrO_2$ and 0 to 3 wt % of a group 1A element oxide.

27. A multilayer wiring board comprising the glass ceramic of claim 10, a conductor and a circuit.

28. A process for manufacturing a low-temperature calcined glass ceramic, comprising the steps of:
 (A) film deposition where a green sheet is prepared from a mixed powder comprising of 50 to 100 wt % of $SiO_2$—$CaO$—$Al_2O_3$ glass powder and 0 to 50 wt % of ceramic powder;
 (B) lamination where the green sheet is piled up and is then hot-pressed to give a laminate;
 (C) calcination where the laminate from the above step is calcined at a temperature of 800 to 100020 C. to give a sintered compact, wherein the glass consists of an oxide-converted composition of 10 to 45 wt % of $SiO_2$, 20 to 50 wt % of CaO, 20 to 45 wt % of $Al_2O_3$, 0.1 to 5 wt % of MgO, 0.1 to 5 wt % of SrO, 0.1 to 5 wt % of BaO, 0.1 to 5 wt % of $TiO_2$, 0.1 to 5 wt % of ZnO, 0.1 to 5 wt % of $ZrO_2$ and 0 to 3 wt % of a group 1A element oxide.

29. A process for manufacturing a low-temperature calcined glass ceramic as claimed in claim 28, where the group 1A element oxide is at least one selected from the group consisting of $Na_2O$, $K_2O$ and $Li_2O$.

30. A process for manufacturing a low temperature calcined glass ceramic as claimed in claim 29, wherein the ceramic particles are particles of at least one selected from the group consisting of $Al_2O_3$ (alumina), $SiO_2$ (silica), $Mg_2Al_4Si_5O_{18}$ (Cordierite), $Mg_2SiO_4$ (Forsterite), $CaAl_2SiO_6$, $Ca_3Si_2O_7$ (Rankinite), $CaSiO_3$ (Wollastonite) and $Al_6Si_2O_{13}$ (Mullite).

31. A process for manufacturing a low-temperature calcined glass ceramic as claimed in claim 30, where during the calcination at least one of the crystals of $CaAl_2SiO_6$, $Ca_3Si_2O_7$(Rankinite), $CaSiO_3$(Wollastonite) and $Al_6Si_2O_{13}$ (Mullite) is precipitated.

32. A process for manufacturing a low-temperature calcined glass ceramic as claimed in claim 29, where during the calcination at least one of the crystals of $CaAl_2SiO_6$, $Ca_3Si_2O_7$(Rankinite), $CaSiO_3$(Wollastonite) and $Al_6Si_2O_{13}$ (Mullite) is precipitated.

33. A process for manufacturing a low temperature calcined glass ceramic as claimed in claim 28, wherein the ceramic particles are particles of at least one selected from the group consisting of $Al_2O_3$ (alumina), $SiO_2$ (silica), $Mg_2Al_4Si_5O_{18}$ (Cordierite), $Mg_2SiO_4$ (Forsterite), $CaAl_2SiO_6$, $Ca_3Si_2O_7$ (Rankinite), $CaSiO_3$ (Wollastonite) and $Al_6Si_2O_{13}$ (Mullite).

34. A process for manufacturing a low-temperature calcined glass ceramic as claimed in claim 33, where during the calcination at least one of the crystals of $CaAl_2SiO_6$, $Ca_3Si_2O_7$(Rankinite), $CaSiO_3$(Wollastonite) and $Al_6Si_2O_{13}$ (Mullite) is precipitated.

35. A process for manufacturing a low-temperature calcined glass ceramic as claimed in claim 28, where during the calcination at least one of the crystals of $CaAl_2SiO_6$, $Ca_3Si_2O_7$(Rankinite), $CaSiO_3$(Wollastonite) and $Al_6Si_2O_{13}$ (Mullite) is precipitated.

* * * * *